(12) United States Patent
Rana et al.

(10) Patent No.: US 8,709,846 B2
(45) Date of Patent: *Apr. 29, 2014

(54) SOLID STATE LIGHTING DEVICES AND ASSOCIATED METHODS OF MANUFACTURING

(71) Applicant: Micron Technology, Inc., Boise, ID (US)

(72) Inventors: Niraj Rana, Boise, ID (US); Zaiyuan Ren, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/927,660

(22) Filed: Jun. 26, 2013

(65) Prior Publication Data

US 2013/0288416 A1 Oct. 31, 2013

Related U.S. Application Data

(62) Division of application No. 13/412,388, filed on Mar. 5, 2012, now Pat. No. 8,476,640, which is a division of application No. 12/693,255, filed on Jan. 25, 2010, now Pat. No. 8,129,205.

(51) Int. Cl.
*H01L 33/00* (2010.01)

(52) U.S. Cl.
USPC ........... 438/47; 438/43; 438/44; 257/E29.089

(58) Field of Classification Search
USPC .............................. 438/26, 27, 43, 44, 733, 47
See application file for complete search history.

(56) References Cited

U.S. PATENT DOCUMENTS

| | | | |
|---|---|---|---|
| 7,361,521 B2 | 4/2008 | Oh et al. |
| 8,129,205 B2 | 3/2012 | Rana et al. |
| 8,476,640 B2 | 7/2013 | Rana et al. |
| 2002/0197841 A1 | 12/2002 | Nagai et al. |
| 2006/0033119 A1 | 2/2006 | Shibata |
| 2007/0134834 A1 | 6/2007 | Chen et al. |
| 2007/0267644 A1 | 11/2007 | Leem |
| 2009/0026472 A1 | 1/2009 | Yasuda et al. |
| 2009/0032799 A1 | 2/2009 | Pan |
| 2009/0261346 A1 | 10/2009 | Chen et al. |
| 2009/0261363 A1 | 10/2009 | Chen et al. |

FOREIGN PATENT DOCUMENTS

| | | |
|---|---|---|
| CN | 100495750 C | 6/2009 |
| JP | 2001284643 A | 10/2001 |
| JP | 2003037287 A | 2/2003 |

(Continued)

OTHER PUBLICATIONS

Feezell, D.F. et al. "Development of Nonpolar and Semipolar InGaN/GaN Visible Light-Emitting Diodes," MRS Bulletin, vol. 34, pp. 318-323, May 2009.
International Search Report and Written Opinion for Application No. PCT/US2011/021687, Sep. 22, 2011, 9 pages.

(Continued)

*Primary Examiner* — Alexander Ghyka
(74) *Attorney, Agent, or Firm* — Perkins Coie LLP

(57) ABSTRACT

Solid state lighting devices and associated methods of manufacturing are disclosed herein. In one embodiment, a solid state light device includes a light emitting diode with an N-type gallium nitride (GaN) material, a P-type GaN material spaced apart from the N-type GaN material, and an indium gallium nitride (InGaN) material directly between the N-type GaN material and the P-type GaN material. At least one of the N-type GaN, InGaN, and P-type GaN materials has a non-planar surface.

20 Claims, 6 Drawing Sheets

(56) References Cited

FOREIGN PATENT DOCUMENTS

| | | |
|---|---|---|
| JP | 2004128107 A | 4/2004 |
| JP | 2007266577 A | 10/2007 |
| JP | 2008227542 A | 9/2008 |

OTHER PUBLICATIONS

Office Action issued Sep. 24, 2013 in Japan Application No. 2012-550084, 7 pages.

Office Action issued Sep. 13, 2013 in Korea Application No. 10-2012-7019001, 13 pages.

Office Action issued Jun. 28, 2013 in Taiwan Application No. 100101848, 9 pages.

US 8,709,846 B2

SOLID STATE LIGHTING DEVICES AND ASSOCIATED METHODS OF MANUFACTURING

CROSS-REFERENCE TO RELATED APPLICATIONS

This application is a divisional of U.S. application Ser. No. 13/412,388 filed Mar. 5, 2012, now U.S. Pat. No. 8,476,640, which is a divisional of U.S. application Ser. No. 12/693,255 filed Jan. 25, 2010, now U.S. Pat. No. 8,129,205, each of which is incorporated herein by reference in its entirety.

TECHNICAL FIELD

The present technology is directed generally to solid state lighting (SSL) devices and associated methods of manufacturing.

BACKGROUND

SSL devices generally use semiconductor light emitting diodes (LEDs), organic light-emitting diodes (OLED), and/or polymer light-emitting diodes (PLED) as sources of illumination rather than electrical filaments, a plasma, or a gas. FIG. 1A is a cross-sectional diagram of a portion of a conventional indium-gallium nitride (InGaN) LED 10. As shown in FIG. 1A, the LED 10 includes a silicon substrate 12, an N-type gallium nitride (GaN) material 14, an InGaN material 16 (and/or InGaN/GaN multiple quantum wells), and a P-type GaN material 18 on one another in series. The LED 10 also includes a first contact 20 on the P-type GaN material 18 and a second contact 22 on the N-type GaN material 14.

One drawback of the LED 10 in FIG. 1A is that the thermal expansion coefficients (TECs) between GaN/InGaN materials 14, 16, and 18 and the silicon substrate 12 are different and may cause the LED 10 to bow and/or otherwise flex under thermal stress. Such bowing or flexing can cause the GaN/InGaN materials 14, 16, and 18 of the LED 10 to crack and/or have other structural defects.

Another drawback of the LED 10 is that the silicon substrate 12 typically includes silicon wafers with a Si(1,1,1) lattice orientation instead of those with a Si(1,0,0) lattice orientation. FIG. 1B is a schematic perspective view of a portion of a silicon lattice illustrating both the Si(1,1,1) and Si(1,0,0) lattice orientations. It is believed that the epitaxial growth of the GaN/InGaN materials 14, 16, and 18 prefers a hexagonal lattice structure provided by the Si(1,1,1) wafers. However, Si(1,1,1) wafers are more expensive than commonly available Si(1,0,0) wafers. Accordingly, several improvements in reliably and cost-effectively manufacturing LEDs may be desirable.

DETAILED DESCRIPTION

Various embodiments of microelectronic substrates having LEDs formed thereon and associated methods of manufacturing are described below. The term "microelectronic substrate" is used throughout to include substrates upon which and/or in which microelectronic devices, micromechanical devices, data storage elements, read/write components, and other features are fabricated. The term "silicon" generally refers to a single crystalline silicon material having a face-centered diamond cubic structure with a lattice spacing of 5.430710 Å. The term "silicon(1,0,0)" and the term "silicon (1,1,1)" generally refer to crystal lattice orientations of (1,0,0) and (1,1,1) as defined by the Miller index, respectively. A discussion of the Miller index can be found in *Handbook of Semiconductor Silicon Technology* by William C. O'Mara, the disclosure of which is incorporated herein in its entirety. A person skilled in the relevant art will also understand that the technology may have additional embodiments, and that the technology may be practiced without several of the details of the embodiments described below with reference to FIGS. 2A-5B.

Figure 1A:
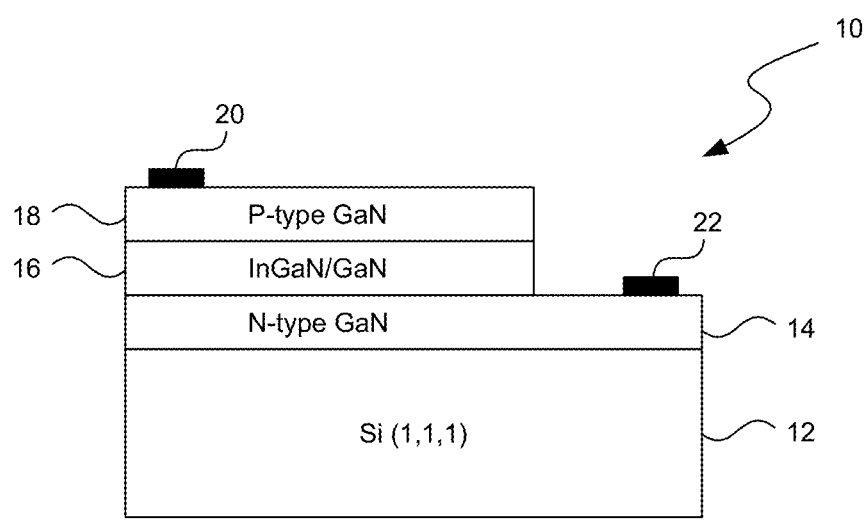
FIG. 1A is a cross-sectional view of a portion of an LED in accordance with the prior art.
Figure 1B:
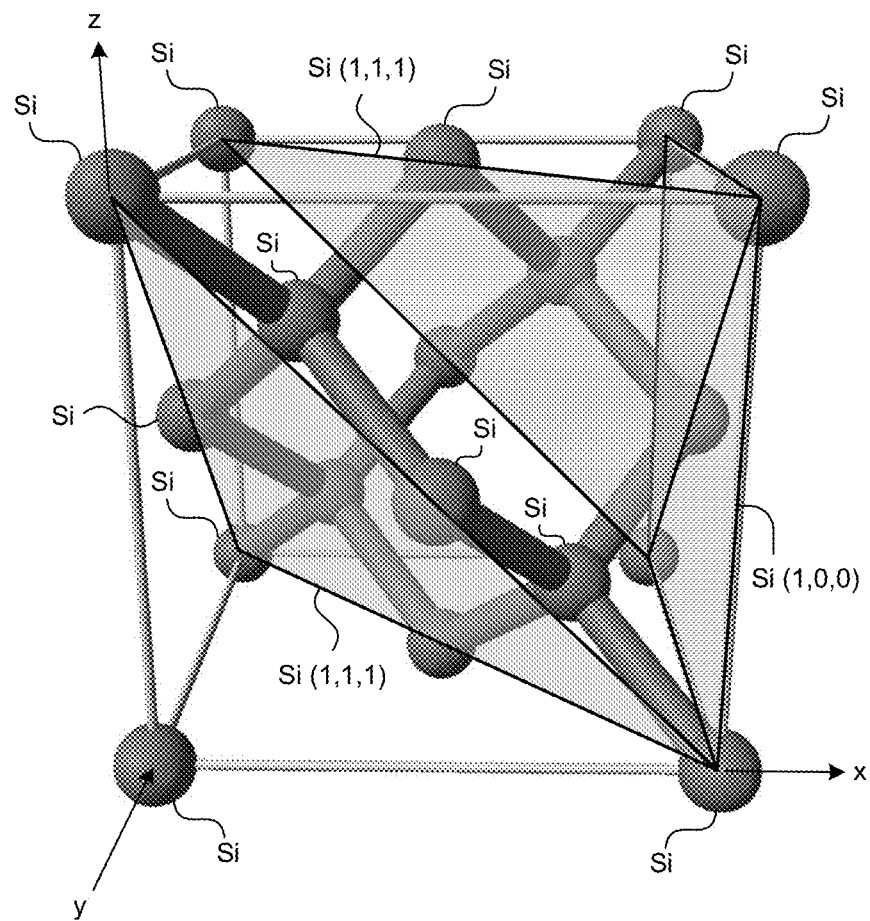
FIG. 1B is a schematic perspective view of a portion of a silicon lattice illustrating Si(1,1,1) and Si(1,0,0) lattice orientations.
Figure 2A:
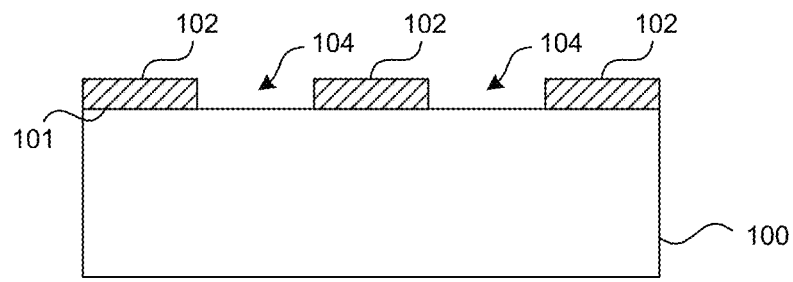
FIGS. 2A-2C are cross-sectional views of a portion of a microelectronic substrate undergoing a process of surface modification in accordance with embodiments of the technology.
Figure 2B:
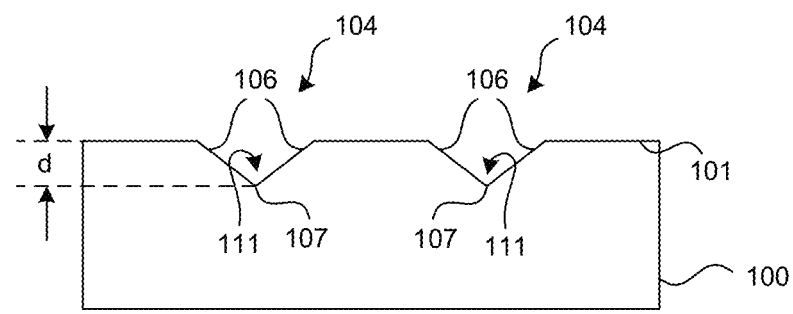

FIGS. 2A and 2B are cross-sectional views of a portion of a microelectronic substrate 100 undergoing a process of surface modification in accordance with embodiments of the technology. In the embodiment shown in FIGS. 2A and 2B, the microelectronic substrate 100 includes a silicon material having the Si(1,0,0) orientation. In other embodiments, the microelectronic substrate 100 may include sapphire ($Al_2O_3$), silicon nitride (SiN), and/or other suitable substrate materials in addition to or in lieu of the silicon material having the Si(1,0,0) orientation.

As shown in FIG. 2A, an initial stage of the process can include depositing a mask material 102 on a surface 101 of the microelectronic substrate 100. In one embodiment, the mask material 102 includes silicon oxide ($SiO_2$) and/or silicon nitride (SiN) formed on the surface 101 via thermal oxidation, chemical vapor deposition (CVD), atomic layer deposition (ALD), and/or other suitable techniques. In other embodiments, the mask material 102 can include a photoresist and/or other suitable mask materials deposited via spin coating and/or other suitable deposition techniques.

The process can then include patterning the deposited mask material 102 via photolithography and/or other suitable techniques. Subsequently, certain portions of the patterned mask material 102 may be removed via wet etching, plasma etching, laser ablation, and/or other material removal techniques. As shown in FIG. 2A, removing the selected portions of the mask material 102 forms a mask having openings 104 through which selected portions of the surface 101 of the microelectronic substrate 100 are exposed.

As shown in FIG. 2B, the process can include forming hexagonal lattice planes on the surface 101 of the microelectronic substrate 100 by removing material from the exposed portions of the surface 101 (e.g., etching the microelectronic substrate 100 via the openings 104). In the illustrated embodiment, the microelectronic substrate 100 includes a Si(1,0,0)

wafer that can react with an alkaline anisotropic etchant (e.g., with a pH greater than about 12) as follows:

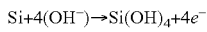

Examples of the anisotropic etchant can include tetra-methyl-ammonium hydroxide (TMAH), potassium hydroxide (KOH), ammonium hydroxide (NH$_4$OH), ethylenediamine pyrocatechol (EDP), and/or another suitable anisotropic etchant. In other embodiments, the process can include treating the exposed portions of the surface 101 with other suitable types of etchants based on the specific materials of the microelectronic substrate 100.

Without being bound by theory, it is believed that TMAH and the other anisotropic etchants can etch silicon substrates at different material removal rates along different crystal planes. For example, it is believed that TMAH can remove silicon material from the Si(1,0,0) planes much faster than that from the Si(1,1,1) planes due, at least in part, to the differences in bonding energy for silicon atoms in these planes. As a result, the Si(1,1,1) planes can act as an etch stop while the silicon material in the Si(1,0,0) planes are etched. Accordingly, treating the exposed portions of the surface 101 of the microelectronic substrate 100 with the alkaline etchant can form a plurality of indentations 111 having Si(1,1,1) planes 106. The mask material 102 can then be removed via wet etching, laser ablation, and/or other suitable techniques.

Figure 2C:
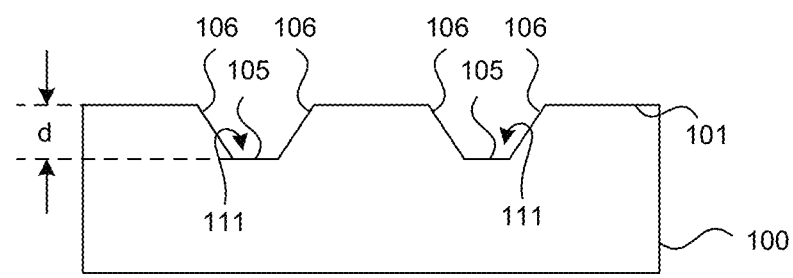

The indentations 111 may have certain profiles by controlling various parameters of the material removal operation. For example, as shown in FIG. 2B, the individual indentations 111 can include two adjacent Si(1,1,1) planes 106 extending from the surface 101 toward the microelectronic substrate 100 and intercepting each other at a junction 107 to form a "zigzag" pattern when a long etching period is used. The two adjacent Si(1,1,1) planes 106 can form an angle of about 72°. In other embodiments, as shown in FIG. 2C, the individual indentations 111 can include two adjacent Si(1,1,1) planes 106 extending from the surface 101 toward the microelectronic substrate 100 and a Si(1,0,0) plane 105 between the two Si(1,1,1) planes 106 if the etching period is shortened. The first and second planes 106 form an angle of about 54° and 126° relative to the Si(1,0,0) plane 105. In any of the foregoing embodiments, the individual indentations 111 can extend into the microelectronic substrate 100 at a depth d from the surface 101.

In certain embodiments, the process includes adjusting etching parameters to control the depth d and/or the final shape of the individual indentations 111. The etching parameters can include a concentration of the etchant, an etching temperature, an etching period, addition of suitable additives, and/or other suitable etching parameters. In certain embodiments, the depth d can be large enough (e.g., greater than about 100 microns) such that later formed GaN/InGaN materials 116 and 118 (FIGS. 3A-3C) do not coalesce on the microelectronic substrate 100, as discussed in more detail below with reference to FIGS. 3A-3C. For example, each of the GaN/InGaN materials 116 and 115 can have independent, generally constant thicknesses in such embodiments. In other embodiments, the depth d can be small enough (e.g., less than about 1 micron) such that later formed GaN/InGaN materials do coalesce on the microelectronic substrate 100, as discussed in more detail below with reference to FIGS. 4A-4C. In such embodiments, one or more of the GaN/InGaN materials can have a thickness that varies. In further embodiments, the depth d can have other desired values such that later formed GaN/InGaN materials partially coalesce.

Figure 3A:
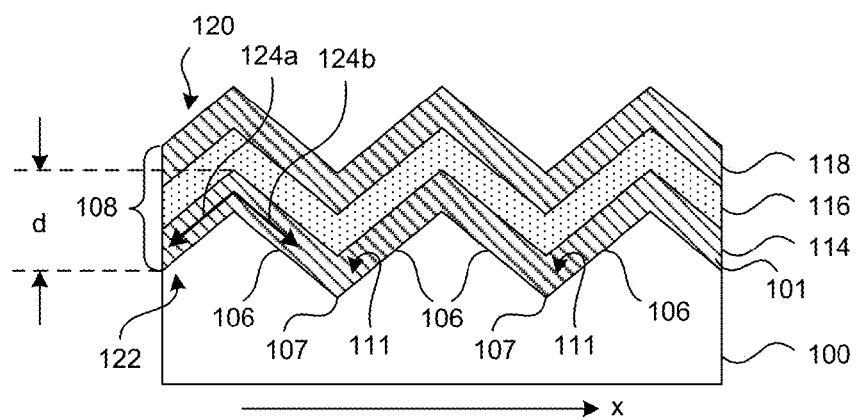
FIGS. 3A-3C are cross-sectional views of a portion of a microelectronic substrate undergoing a process of forming non-planar LED structures in accordance with embodiments of the technology.
Figure 3B:
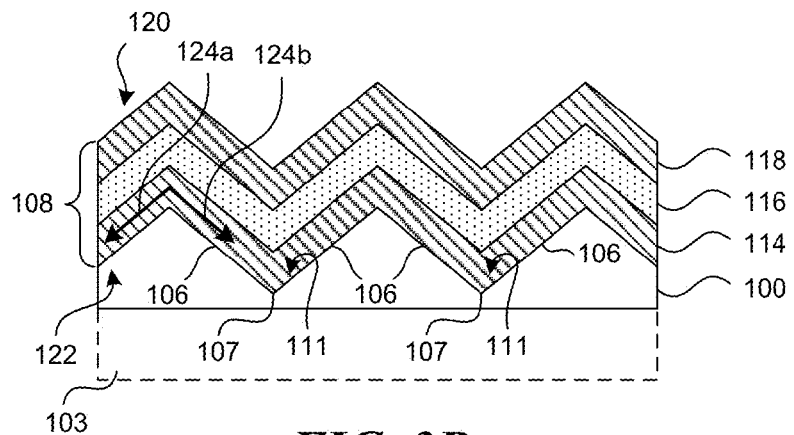
Figure 3C:
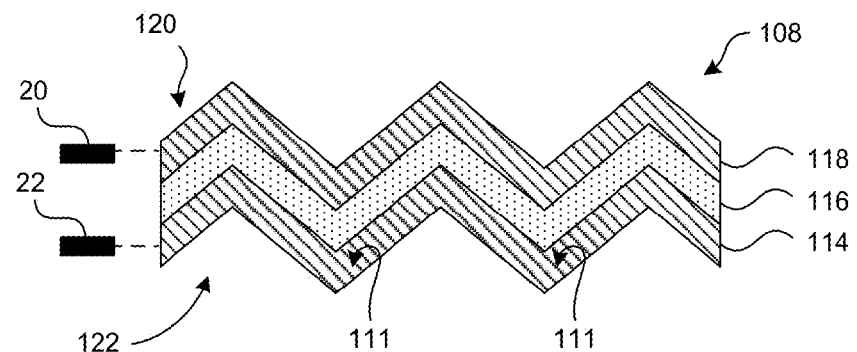

FIGS. 3A-3C are cross-sectional views of a portion of the microelectronic substrate 100 undergoing a process of forming non-planar LED structures in accordance with embodiments of the technology. As shown in FIG. 3A, the process can include forming an LED structure 108 on the surface 101 of the microelectronic substrate 100 with the indentations 111. In one embodiment, forming the LED structure 108 can include depositing an N-type GaN material 114 (e.g., silicon doped), an InGaN material 116, and a P-type GaN material 118 (e.g., magnesium doped) on the microelectronic substrate 100 in series. In other embodiments, forming the LED structure 108 can also include depositing at least one of gallium arsenide (GaAs), aluminum gallium arsenide (AlGaAs), gallium arsenide phosphide (GaAsP), aluminum gallium indium phosphide (AlGaInP), gallium(III) phosphide (GaP), zinc selenide (ZnSe), boron nitride (BN), aluminum nitride (AlN), aluminum gallium nitride (AlGaN), aluminum gallium indium nitride (AlGaInN), and/or other suitable semiconductor materials. Techniques for forming the LED structure 108 can include metal organic CVD (MOCVD), molecular beam epitaxy (MBE), liquid phase epitaxy, and/or other suitable techniques.

In the illustrated embodiment of FIG. 3A, the LED structure 108 includes non-planar first and second surfaces 120 and 122 that individually have a zigzag pattern. The first and second surfaces 120 and 122 generally conform to the zigzag pattern of the Si(1,1,1) planes 106 on the surface 101 of the substrate. Without being bound by theory, it is believed that the zigzag pattern of the first and second surfaces 120 and 122 can at least reduce flexing of the GaN/InGaN materials 114, 116, and 118 relative to the microelectronic substrate 100 under thermal stress. It is believed that the difference in TEC of the GaN/InGaN materials 114, 116, and 118 and the substrate 100 can create tensile stress (as indicated by the arrows 124a and 124b) along the first and second surfaces 120 and 122. As shown in FIG. 3A, the zigzag pattern forces the tensile stress 124a and 124b to be at least partially opposite each other along two sides of the zigzag pattern. As a result, the tensile stress 124a and 124b can at least partially cancel each other (e.g., in the horizontal plane X) to reduce bowing and/or otherwise flexing of the GaN/InGaN materials 114, 116, and 118.

As shown in FIG. 3B, the process can then include removing a bottom portion 103 of the microelectronic substrate 100 via mechanical processes, such as back grinding, and/or other suitable techniques. As shown in FIG. 3C, the process can also include removing the remaining microelectronic substrate 100 from the LED structure 108 via wet etching, dry etching, and/or other suitable techniques. The process can further include forming the first and second contacts 20 and 22 for the P-type GaN material 118 and the N-type GaN material 114, respectively, and/or other subsequent processing operations.

Figure 4A:
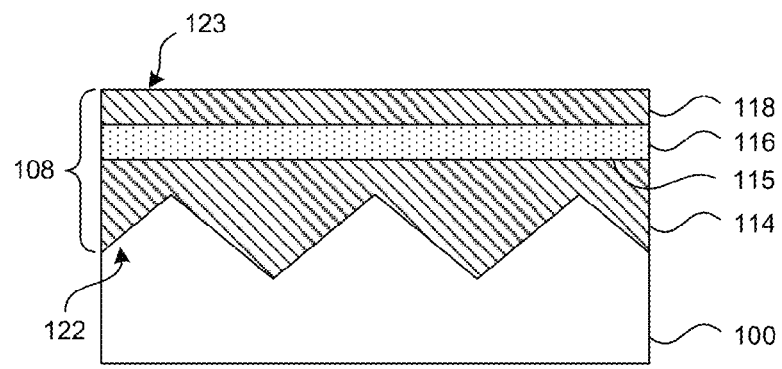
FIGS. 4A-4C are cross-sectional views of a portion of a microelectronic substrate undergoing a process of forming partially planar LED structures in accordance with embodiments of the technology.
Figure 4B:
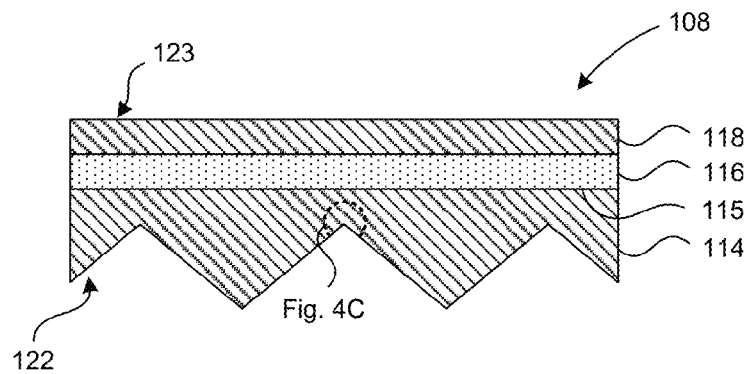
Figure 4C:
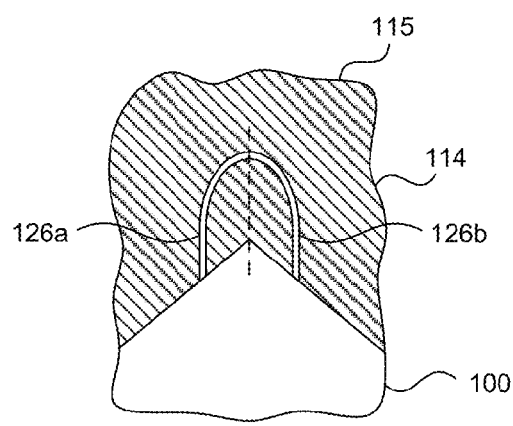

FIGS. 4A and 4B are cross-sectional views of a portion of the microelectronic substrate 100 undergoing a process of forming partially planar LED structures in accordance with embodiments of the technology. FIG. 4C is a partially enlarged cross-sectional view of a portion of the planar LED in FIG. 4B. As shown in FIG. 4A, the process can include forming an LED structure 108 on the microelectronic substrate 100 by depositing an N-type GaN material 114 (e.g., silicon doped), an InGaN material 116, and a P-type GaN material 118 (e.g., magnesium doped) on the microelectronic substrate 100 in series. In the illustrated embodiment, the N-type GaN material 114 coalesced while being formed on the microelectronic substrate 100. As a result, the thickness of the N-type GaN material 114 is not constant such that it has a generally planar surface 115 opposite the microelectronic substrate 100. In other embodiments, the InGaN material 116 and/or the P-type GaN material 118 may coalesce to have a generally planar surface (not shown). The process can then include removing a bottom portion of the microelectronic substrate 100 via back grinding and removing the remaining microelectronic substrate 100 from the LED structure 108 via wet etching, dry etching, and/or other suitable techniques, as discussed above with reference to FIGS. 3B and 3C to yield the LED structure 108 as shown in FIG. 4B.

It is believed that coalescing at least one of the GaN/InGaN materials 114, 116, and 118 can reduce a dislocation density in the LED structure 108. The term "dislocation" generally refers to a crystallographic defect, or irregularity, within a crystal structure. For example, as shown in FIG. 4C, the N-type GaN material 114 includes a first dislocation 126a and a second dislocation 126b on two sides of the zigzag pattern. It is believed that during deposition of the N-type GaN material 114, surface tension and/or other physical/chemical interactions may cause the first and second dislocations 126a and 126b to bend toward each other and form a loop if the Burgers vectors of these two dislocations 126a and 126b have different signs. As a result, none of the first and second dislocations 126a and 126b would extend all the way to the surface 115 of the N-type GaN material 114 thus reducing the dislocation density of the N-type GaN material 114.

Several embodiments of the LED 108 discussed above with reference to FIGS. 2A-5B can have increased light emitting surface areas compared to conventional LEDs. For example, as shown in FIGS. 2B and 2C, the indentations 111 can increase the surface area upon which the LED structure 108 (FIGS. 3A-3C) can be formed. As a result, the LED structure 108 can have an increased light emitting area without increasing the footprint of the LED structure 108.

Figure 5A:
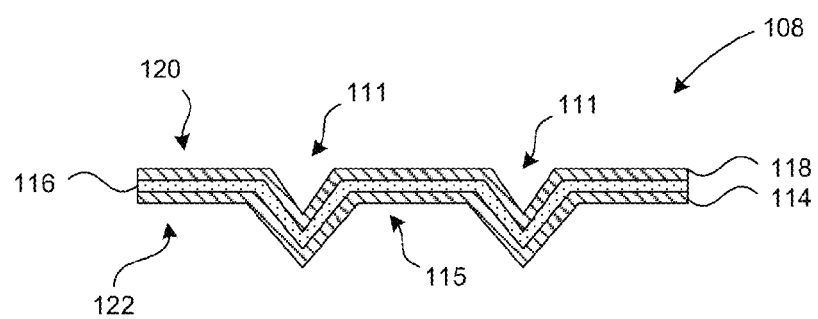
FIGS. 5A and 5B are cross-sectional views of a portion of a microelectronic substrate undergoing a process of forming additional LED structures in accordance with embodiments of the technology.
Figure 5B:
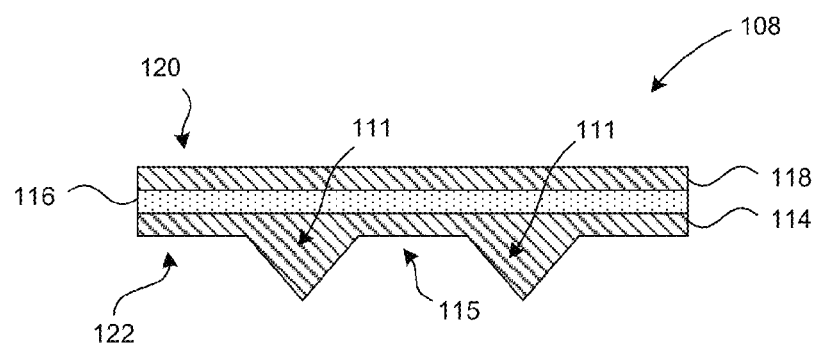

Even though the LED structures 108 are discussed above as having at least one surface with a zigzag pattern, in other embodiments, the LED structures 108 can also have other surface patterns. For example, as shown in FIG. 5A, by adjusting a width of the mask material 102 (FIGS. 2A and 2B), the indentations 111 may be separated from one another by a planar portion 115 of the N-type GaN material 114, and the InGaN and P-type GaN materials 116 and 118 may generally conform to the N-type GaN material 114. As a result, the LED structure 108 can include non-planar first and second surfaces 120 and 122. In another embodiment, as shown in FIG. 5B, at least one of the InGaN and P-type GaN materials 116 and 118 may coalesce on the N-type GaN material 114. As a result, the LED structure 108 can include a generally planar first surface 120 and a non-planar second surface 122. In other embodiments, the LED structures 108 may have other suitable surface patterns.

In certain embodiments, the process can also include forming a mirror layer (e.g., aluminum, not shown) and a support structure (e.g., a silicon and/or silicon oxide material, not shown) on first surface 120 of the LED structures 108 (FIG. 3A-3C). In further embodiments, the process can include depositing buffer materials (e.g., aluminum oxide, aluminum nitride, etc.) and/or other suitable materials on the surface of the microelectronic substrate 100 (FIG. 3A) before the N-type GaN material 114 is formed on the microelectronic substrate 100.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

We claim:

1. A method for processing a silicon substrate, comprising: forming a solid state lighting (SSL) structure on a substrate, the substrate having a substrate material with a Si(1,0,0) lattice orientation, wherein the SSL structure includes an N-type gallium nitride (GaN) material, an indium gallium nitride (InGaN) material, and a P-type GaN material, and wherein at least one of the N-type GaN, InGaN, and P-type GaN materials has a non-planar surface with a plurality of symmetric protrusions extending along a Si(1,1,1) plane, and wherein the symmetric protrusions are formed with tips, and wherein the symmetric protrusions at least partially reduce a total tensile stress among the N-type GaN, InGaN, and P-type GaN materials by at least partially canceling opposite tensile stresses at the tips along the non-planar surface;
forming a first contact electrically coupled to the P-type GaN; and
forming a second contact electrically coupled to the N-type GaN.

2. The method of claim 1 wherein the non-planar surface has a zigzag pattern.

3. The method of claim 1 wherein the individual protrusions include a first sidewall and a second sidewall joined together at a junction.

4. The method of claim 1 wherein the individual protrusions include a first sidewall and a second sidewall joined together at a junction, the first and second sidewalls forming an angle of about 72°.

5. The method of claim 1 wherein the individual protrusions include a first sidewall, a second sidewall, and a third sidewall extending between the first and second sidewalls, the first and second sidewalls forming an angle of about 54° and 126° with the third sidewall, respectively.

6. The method of claim 1 wherein the N-type GaN, InGaN, and P-type GaN materials each have a generally constant thickness.

7. The method of claim 1 wherein at least one of the N-type GaN, InGaN, and P-type GaN materials have a generally planar surface opposite the non-planar surface.

8. The method of claim 1 wherein forming the SSL structure further comprises:
depositing the N-type GaN material, the InGaN material, and the P-type GaN material on the substrate; and
coalescing at least one of the N-type GaN, InGaN, and P-type GaN materials during deposition.

9. A method of manufacturing a microelectronic assembly, comprising:
forming a silicon substrate having a surface with a plurality of indentations, the silicon substrate having a Si(1,0,0) lattice orientation at the surface, wherein the indentations are defined by at least one plane with a Si(1,1,1) lattice orientation; and
forming a solid-state lighting (SSL) structure carried by the silicon substrate, the SSL structure having an N-type gallium nitride (GaN) material, a P-type GaN material spaced apart from the N-type GaN material, and an indium gallium nitride (InGaN) material between the N-type GaN material and the P-type GaN material, wherein at least one of the N-type GaN, InGaN, and P-type GaN materials has a non-planar surface with a plurality of symmetric protrusions formed with tips, and wherein the symmetric protrusions at least partially reduce a total tensile stress among the N-type GaN, InGaN, and P-type GaN materials by at least partially canceling opposite tensile stresses at the tips along the non-planar surface.

10. The method of claim 9 wherein the individual symmetric protrusions include two adjacent Si(1,1,1) planes intersecting one another at a junction, the junction having an angle of about 72°.

11. The method of claim 9 wherein the individual symmetric protrusions include first and second planes having Si(1,1,1) lattice orientations and a third plane having a Si(1,0,0) lattice orientation, wherein the first and second planes form an angle of about 54° and 126° with the third plane, respectively.

12. The method of claim 9 wherein the plurality of symmetric protrusions are generally conforming to the indentations of the silicon substrate.

13. The method of claim 9 wherein at least one of the N-type GaN, InGaN, and P-type GaN materials includes a planar surface opposite to the non-planar surface.

14. The method of claim 9 wherein the N-type GaN, InGaN, and P-type GaN materials each have a generally constant thickness.

15. The method of claim 9 wherein at least one of the N-type GaN, InGaN, and P-type GaN materials has a non-uniform thickness.

16. A method for processing a silicon substrate, comprising:

forming a light emitting diode (LED) structure on a substrate, the substrate having a substrate material with a Si(1,0,0) lattice orientation, wherein forming the LED structure includes depositing an N-type gallium nitride (GaN) material, an indium gallium nitride (InGaN) material, and a P-type GaN in sequence and coalescing at least one of the N-type GaN, InGaN, and P-type GaN materials during deposition, and wherein the coalescing reduces a dislocation density in at least one of the N-type GaN, InGaN, and P-type GaN materials by at least partially canceling opposite tensile stresses along at least one non-planar surface of the N-type GaN, InGaN, and P-type GaN materials;

forming a first contact electrically coupled to the P-type GaN; and forming a second contact electrically coupled to the N-type GaN.

17. The method of claim 16 wherein the non-planar surface includes a plurality of symmetric protrusions formed with tips.

18. The method of claim 17 wherein canceling the opposite tensile stresses along at least one non-planar surface includes canceling the opposite tensile stresses at the tips.

19. The method of claim 16 wherein the N-type GaN, InGaN, and P-type GaN materials each have a generally constant thickness.

20. The method of claim 16 wherein at least one of the N-type GaN, InGaN, and P-type GaN materials has a non-uniform thickness.

\* \* \* \* \*